United States Patent
Skjoldborg

(12) 
(10) Patent No.: US 11,290,817 B2
(45) Date of Patent: Mar. 29, 2022

(54) HEADSET SYSTEM WITH A HEADSET AND A CONTROL BOX

(71) Applicant: GN Audio A/S, Ballerup (DK)

(72) Inventor: Erling Skjoldborg, Lyngby (DK)

(73) Assignee: GN Audio A/S, Ballerup (DK)

( * ) Notice: Subject to any disclaimer, the term of this patent is extended or adjusted under 35 U.S.C. 154(b) by 0 days.

(21) Appl. No.: 17/054,691

(22) PCT Filed: Jun. 1, 2018

(86) PCT No.: PCT/EP2018/064494
§ 371 (c)(1),
(2) Date: Nov. 11, 2020

(87) PCT Pub. No.: WO2019/228650
PCT Pub. Date: Dec. 5, 2019

(65) Prior Publication Data
US 2021/0084413 A1   Mar. 18, 2021

(51) Int. Cl.
| | | |
|---|---|---|
| H04R 25/00 | (2006.01) | |
| H04R 5/033 | (2006.01) | |
| H03M 1/12 | (2006.01) | |
| H03M 1/66 | (2006.01) | |
| H04R 1/08 | (2006.01) | |

(Continued)

(52) U.S. Cl.
CPC .............. *H04R 5/033* (2013.01); *H03M 1/12* (2013.01); *H03M 1/66* (2013.01); *H04R 1/08* (2013.01); *H04R 1/1008* (2013.01); *H04R 1/1041* (2013.01); *H04R 5/04* (2013.01)

(58) Field of Classification Search
CPC .......... H04R 5/033; H04R 1/08; H04R 1/008; H04R 1/1041; H04M 1/12; H04M 1/66
See application file for complete search history.

(56) References Cited

U.S. PATENT DOCUMENTS 6,203,344 B1 * 3/2001 Ito ..................... H01R 27/00
439/218
2010/0040240 A1 * 2/2010 Bonanno ................. H04S 1/005
381/74

(Continued)

FOREIGN PATENT DOCUMENTS

| CN | 105554611 A | 5/2016 |
| WO | 2015007303 A1 | 1/2015 |
| WO | 2016050730 A1 | 4/2016 |

OTHER PUBLICATIONS

International Search Report and Written Opinion issued in PCT/EP2018/064494, dated Feb. 9, 2019.

*Primary Examiner* — Simon King
(74) *Attorney, Agent, or Firm* — Hamre, Schumann, Mueller & Larson, P.C.

(57) ABSTRACT

A headset system comprising a headset, which headset comprises at least a first earphone, a D/A converter, a first cable and a first connector. The headset system further comprises a control box, which control box comprises a second connecter, which is adapted to be connected to the first connector, and a third connector which is adapted to be connected to a fourth connector of a computing device. The control box comprises a user interface. The D/A converter is arranged at the headset and the control box is adapted to send control signals via the first cable to the headset, when the user interface is activated by a user.

11 Claims, 3 Drawing Sheets

(51) Int. Cl.
*H04R 1/10* (2006.01)
*H04R 5/04* (2006.01)

(56) References Cited

U.S. PATENT DOCUMENTS

| | | | |
|---|---|---|---|
| 2010/0161856 A1* | 6/2010 | Ding | H04R 3/00 |
| | | | 710/62 |
| 2016/0041808 A1* | 2/2016 | Pelland | H04R 3/00 |
| | | | 381/123 |
| 2016/0219138 A1* | 7/2016 | Ekner | H04M 3/58 |
| 2018/0027320 A1 | 1/2018 | Liu et al. | |
| 2019/0058617 A1* | 2/2019 | Kolsrud | G06F 13/382 |

* cited by examiner

HEADSET SYSTEM WITH A HEADSET AND A CONTROL BOX

TECHNICAL FIELD

The invention relates to a headset system comprising a headset, which headset comprises at least a first earphone, a D/A converter, a first cable and a first connector, and wherein the headset system further comprises a control box, which control box comprises a second connecter, which is adapted to be connected to the first connector, and a third connector which is adapted to be connected to a fourth connector of a computing device, and which control box comprises a user interface.

BACKGROUND ART

Headset systems exist in several configurations. Many smartphones are sold with a simple analogue headset with a TRRS jack connector. An inline control box on the cable allows the user to control the smartphone, for example to play, pause, skip to next song, accept an incoming call etc. By pressing a button on the inline control box, two of the channels are momentarily interconnected across a resistance, whereby the smartphone can detect a voltage drop or ampere drop. This system has ben used for many years, but has strong limitations regarding the signal communication between the headset and the smartphone. In the later years digital communication between a headset and an audio device such as a laptop has increased by wireless means and digital cabling, such as cabling according to the USB standards. The USB standard provides at least one power pin ($V_{BUS}$), one Ground pin, one Data+ pin and one Data− pin. The power pin provides electrical power to the electronics, such as f. ex. a D/A-A/D converter, noise cancelling circuits etc. in the headset. Some headset systems are provided with a control box, which can be connected to a personal computer. The control box can include a D/A-A/D converter and a TRRS jack socket which can receive a 3.5 mm TRRS jack of a corded headset. Jabra Evolve 80 is an example of such a headset system. The headset itself comprises an internal rechargeable battery and an active noise cancellation circuit. The battery can be recharged via a fifth connector on the sleeve of the TRRS jack connector. The 3.5 mm jack can be disconnected from the control box and inserted into a 3.5 mm socket of f. ex. a smart phone. A problem with this headset system is, that the headset without the control box can only be used with analogue audio signals.

DISCLOSURE OF INVENTION

The headset system according to the invention characterized in that the D/A converter is arranged at the headset and that the control box is adapted to send control signals via the first cable to the headset, when the user interface is activated by a user. This headset system is flexible, as the headset can be coupled to digital sources with or without the control box.

According to an embodiment, the headset further comprises a microphone and an A/D converter.

The headset system may be adapted to transmit the audio signal in digital format between the control box and the headset.

The headset system may be adapted to transmit the audio signal directly from the third connector to the first connector without any conversion.

According to an embodiment, the first and second connectors connector (5, 6) comprise a $V_{BUS}$ pin, a Data+ pin, a Data− pin and a Ground pin.

According to an embodiment, the headset system is adapted to send control signals as power-line communication from the control box via the $V_{BUS}$ pin to the headset.

According to an embodiment, the control box comprises a programmable circuit, wherein the headset system is adapted to send firmware update as power-line communication from the headset via the $V_{BUS}$ pin and the Ground pin to the control box.

According to an embodiment, the third connector comprises a $V_{BUS}$ pin, a Data+ pin, a Data− pin and a Ground pin.

According to an embodiment, the first connector is a USB-C connector.

According to an embodiment, the third connector is a USB Type A connector.

According to an embodiment, the user interface of the control box comprises push buttons.

MODES FOR CARRYING OUT THE INVENTION

Figure 1:
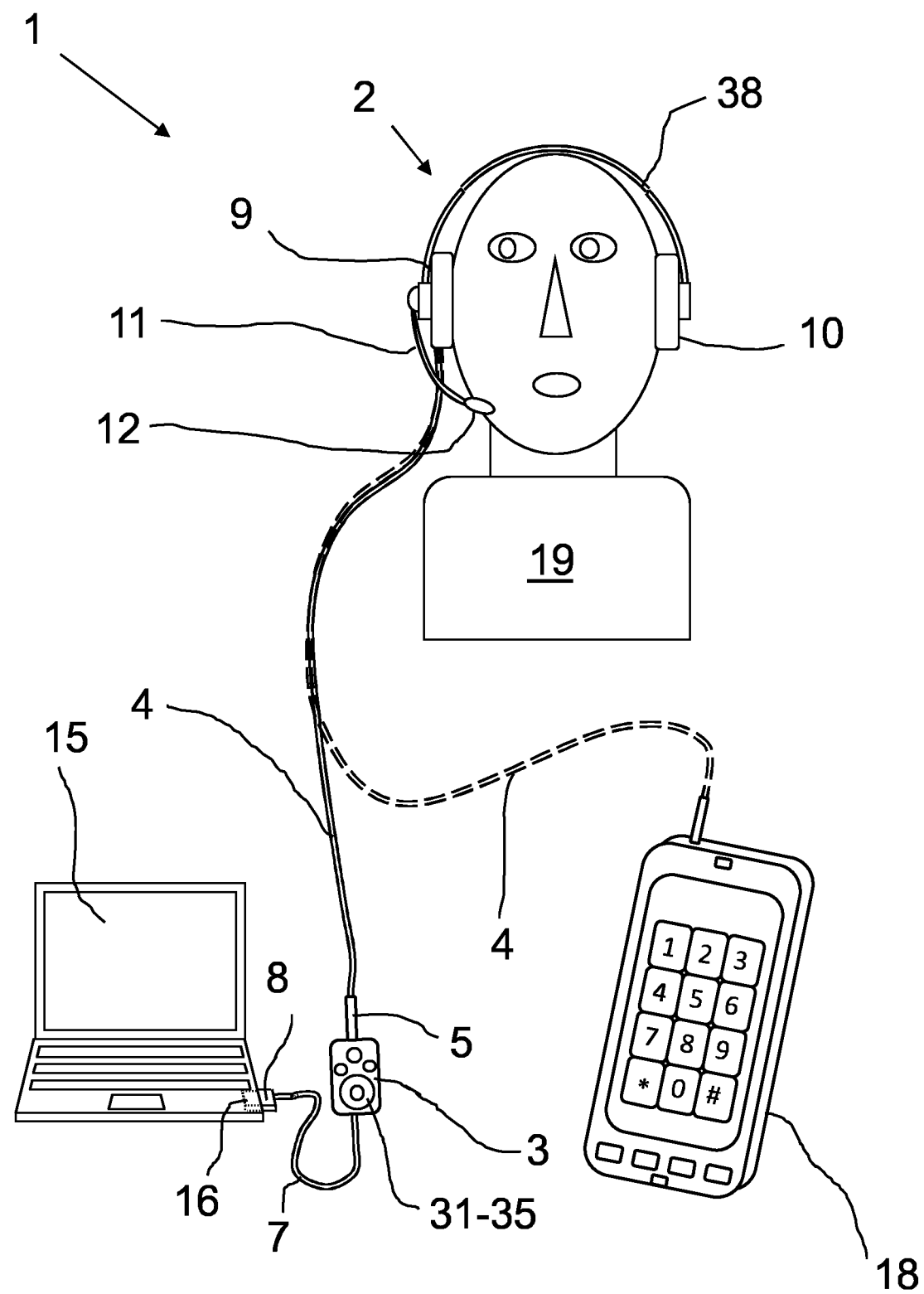
FIG. 1 discloses a headset system according to the invention.

FIG. 1 discloses a headset system 1 according to this specification. The headset system 1 comprises a headset 2, a first cable 4 with a first connector 5. The first connector 5 can be inserted into a second connector 6 (see FIG. 2) of a control box 3. A second cable 7 extends from the control box 3 and comprises at its free end a third connector 8, which can be inserted into a fourth connector 16 of a personal computer 15. The headset 2 according to the shown embodiment is a duo headset comprising a first earphone 9, a second earphone 10, a headband 38 interconnecting the first and second earphones 9, 10, a microphone arm 11 extending from the first earphone 9 and a microphone 12 at the free end of the microphone arm 11. The housing of the first earphone 9 comprises electronics, which will be described in relation to FIG. 3. The first cable 4 extending from the first earphone 9 is a 4 wire cable and the first connector 5 is a USB-C plug. The second connector 6 is a USB-C receptacle. The second cable 7 extending from the control box 3 is a standard USB cable and the third connector 8 is a USB Type A plug. The fourth connector 16 is a USB Type A receptacle. As shown in FIG. 1, the headset 2 is connected to the PC 15 via the control box 3. However, as shown with dashed lines, the first connector 5 can be unplugged from the control box 3 and connected to a USB-C receptacle of a smartphone 18. Thus, the user 19 can use the headset for communications over the smartphone without the use of the control box 3. The user 19 can also plug the first connector 5 directly into a USB-C receptacle of a PC and use a softphone on the PC 15 without using the control box 3. However, in many cases, the control box 3 provides advantages which will be explained in the following.

Figure 2:
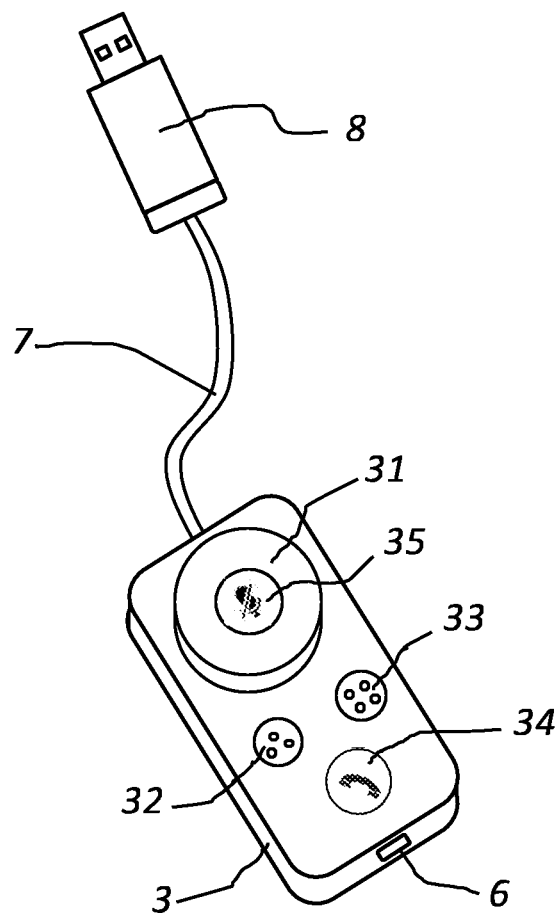
FIG. 2 discloses a control box of a headset system according to the invention.

FIG. 2 shows the control box 3 in greater detail. The control box 3 comprises the second cable 7 with the third connector 8, which is a USB Type A plug. However, it could also be a USB-C plug. The second connector 6, which is a USB-C receptacle, can be seen on the front most end in FIG. 2. On the top surface the control box 3 comprises a number of control buttons. These buttons include a large rotatable volume button 31, first and second programmable push buttons 32, 33, an answer/end call push button 34 and a mute/un-mute button 35 at the centre of the volume button 31. The first programmable push button 32 is by default set as a speed dial button, and the second programmable button 33 is default set as a busy-light button. All the push buttons 32-35 have LED illuminated ring around their periphery, that lightens up, when the function of the button is activated.

Figure 3:
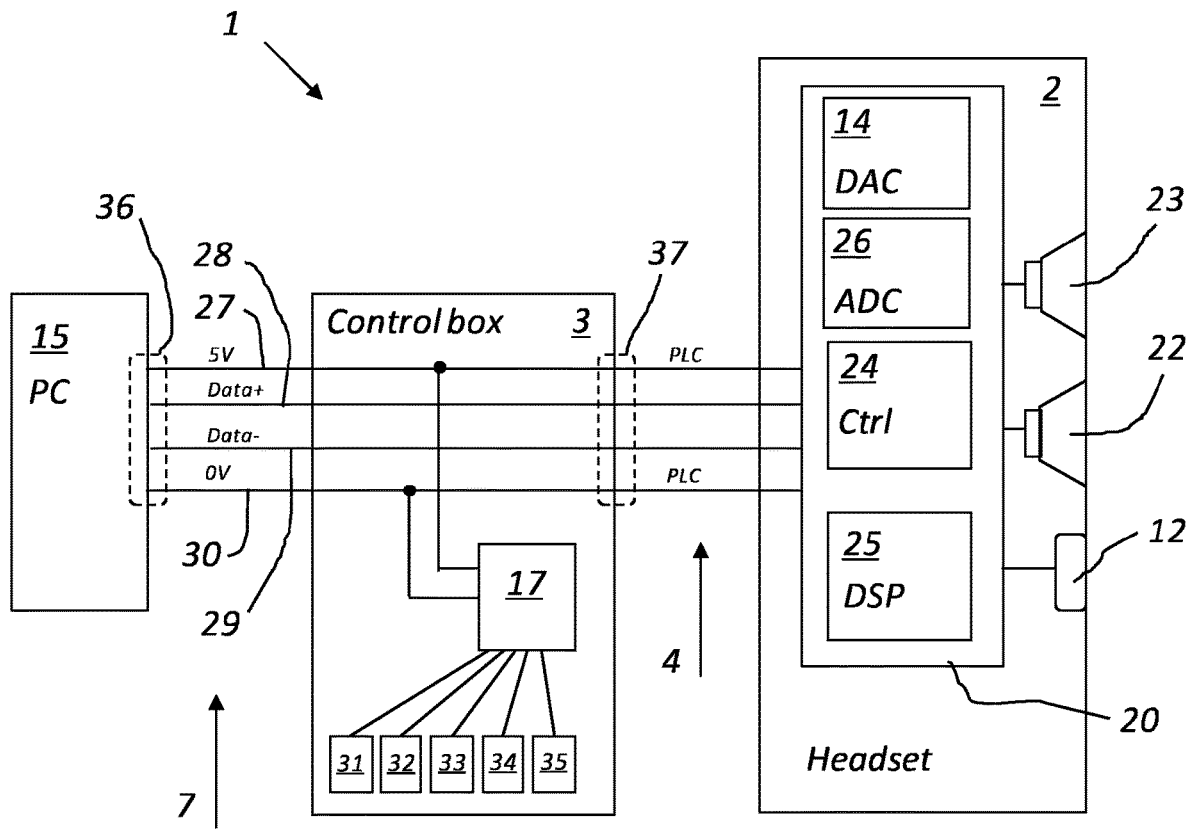
FIG. 3 discloses a schematic view of the headset system of FIG. 1.

FIG. 3 discloses a schematic view of the electronic parts of the headset system 1. As earlier mentioned, the connection between the control box 3 and the PC 15 is a standard USB connection, which comprises the following 4 pins: $V_{BUS}$ 27, Data+ 27, Data− 29 and Ground 30. The interface 36 between the second cable 7 and the PC 25 is a standard USB Type A interface with the four mentioned pins 27, 28, 29, 30. The first cable 4 connecting the headset 2 and the control box 3 is as previously mentioned a 4-wire cable provided with the same 4 pins as the second cable 7. Thus, the USB-C plug 5 at the end of the first cable 4 provides together with the USB-C receptacle 6 in the control box 3 a USB-C interface 37. USB-C is a 24-pin USB connector system. However, only the four pins of the standard USB connection are in use here. The Data+ pin 28 and Data− pin 29 are running through the control box 3 from the second cable 7 to the USB-C receptacle without being connected to any electronic circuitry within the control box 3. The control box 3 comprises a controller circuit 17. This controller circuit 17 is connected to the control buttons 31-35 and the $V_{BUS}$ and Ground data pins 27, 30.

The headset 2 comprises a first speaker 22, a second speaker 23, a microphone 12 and a circuitry 20 comprising a D/A converter 14, an A/D converter 26, a controller circuitry 24 and a Digital Signal Processing circuitry 25. The interconnections between these different parts are not shown in detail for clarity reasons. Furthermore, only essential parts relevant for this specification are shown. Although the USB-C standard used for the first cable 4 and the first connector 5 has 24 pins, only four of the pins are used here. Power to feed the headset circuitry 20 are received form the $V_{BUS}$ pin 27 and audio and other data are digitally communicated to and from the PC 25 via the data pins 28, 29. The analogue signals from the microphone 12 is converted by the AD converter 26 to digital format and transmitted to the PC vi the data pins 28, 29. Digital audio signals received via the data pins 28, 29 from the PC 25 are converted by the DA converter 14 to analogue signals, which are sent to the speakers 22, 23. The headset 2 itself has no user face such as control buttons. The user can remote control the softphone on the PC 25 by means of the control buttons 31-35 on the control box 3. When activating the buttons control 31-35, signals are transmitted via the $V_{BUS}$ 27 as so-called PLC signals. PLC is an acronym for Power Line Communication and means that data and power are transmitted over the same line. In this case, control signals are transmitted as a superimposed signal added to the supplied 5 Volt on the $V_BUS$ pin 27.

Figure 4:
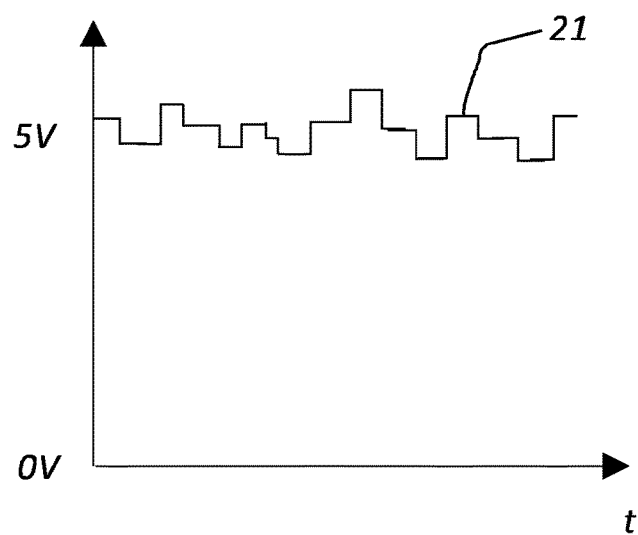
FIG. 4 discloses a Power Line Communication signal, which is communicated between the control box and a headset of the headset system.

FIG. 4 shows schematic how the 5 Volt supply signal has a superimposed control signal 21. This superimposed or embedded control signal 21 is detected by a filter in the controller circuit 24 of the headset 2. The signal 21 is converted to a signal which can be sent via the data pins 27, 29 to the PC 25.

The circuit 17 or a part of the circuit 17 of the control box 3 can be a programmable chip programmed with firmware. A firmware update can be done with PLC signals. Thus, a firmware update can be controlled from the PC 25, and the firmware is sent via the data pins 28, 29 from the PC 25 to the headset 2 and as PLC signals from the headset 2 to the control box 3.

With this solution, a cheap efficient system is obtained. There is no need to provide the control box 3 with a complex circuit, such as a USB-C chipset.

USB-C is also called USB type C.

| | Reference signs: |
|---|---|
| 1 | headset system |
| 2 | headset |
| 3 | control box |
| 4 | cable |
| 5 | first connector |
| 6 | second connector |
| 7 | second cable |
| 8 | third connector |
| 9 | first earphone |
| 10 | second earphone |
| 11 | microphone arm |
| 12 | microphone |
| 13 | control buttons |
| 14 | D/A converter |
| 15 | personal computer |
| 16 | fourth connector |
| 17 | circuit of control box |
| 18 | smartphone |
| 19 | user |
| 20 | circuit of headset |
| 21 | PLC signal |
| 22 | first speaker |
| 23 | second speaker |
| 24 | controller of headset |
| 25 | digital signal processor of headset |
| 26 | A/D converter |
| 27 | $V_{BUS}$ pin |
| 28 | Data+ pin |
| 29 | Data− pin |
| 30 | Ground pin |
| 31 | volume knob |
| 32 | programmable button |
| 33 | programmable button |
| 34 | answer/end button |
| 35 | mute/un-mute button |
| 36 | USB Type A interface |
| 37 | USB-C interface |
| 38 | headband |

The invention claimed is:

1. A headset system comprising: a headset, which headset comprises at least a first earphone, a D/A converter, a first cable and a first connector, and wherein the headset system further comprises a control box, which control box comprises a second connecter, which is adapted to be connected to the first connector, and a third connector which is adapted to be connected to a fourth connector of a computing device, and which control box comprises a user interface, wherein the D/A converter is arranged at the headset and that the control box is adapted to send control signals via the first cable to the headset, when the user interface is activated by a user.

2. A headset system according to claim 1, wherein the headset further comprises a microphone and an A/D converter.

3. A headset system according to claim 1, which is adapted to transmit the audio signal in digital format between the control box and the headset.

4. A headset system according to claim 3, which is adapted to transmit the audio signal directly from the third connector to the second connector without any conversion.

5. A headset system according to claim 1, wherein the first and second connectors connector comprise a $V_{BUS}$ pin, a Data+ pin, a Data− pin and a Ground pin.

6. A headset system according to claim 5, which is adapted to send control signals as power-line communication from the control box via the $V_{BUS}$ pin to the headset.

7. A headset system according to claim 5, wherein the control box comprises a programmable circuit, and wherein the headset system is adapted to send firmware update as power-line communication from the headset via the $V_{BUS}$ pin and the Ground pin to the control box.

8. A headset system according to claim 5, wherein the third connector comprises a $V_{BUS}$ pin, a Data+ pin, a Data− pin and a Ground pin.

9. A headset system according to claim 5, wherein the first connector is a USB-C connector.

10. A headset system according to claim 5, wherein the third connector is a USB Type A connector.

11. A headset system according to claim 5, wherein the user interface of the control box comprises push buttons.

\* \* \* \* \*